(12) United States Patent
Noh

(10) Patent No.: US 9,865,803 B2
(45) Date of Patent: Jan. 9, 2018

(54) ELECTRONIC DEVICE AND METHOD FOR FABRICATING THE SAME

(71) Applicant: SK hynix Inc., Icheon-Si (KR)

(72) Inventor: Seung-Mo Noh, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/237,429

(22) Filed: Aug. 15, 2016

(65) Prior Publication Data

US 2017/0155040 A1 Jun. 1, 2017

(30) Foreign Application Priority Data

Nov. 30, 2015 (KR) .................. 10-2015-0168587

(51) Int. Cl.
| | | |
|---|---|---|
| *H01L 29/82* | (2006.01) | |
| *H01L 43/08* | (2006.01) | |
| *G06F 12/0831* | (2016.01) | |
| *G11C 11/16* | (2006.01) | |
| *H01L 43/02* | (2006.01) | |
| *H01L 27/22* | (2006.01) | |
| *H01L 43/12* | (2006.01) | |
| *H01L 49/02* | (2006.01) | |

(52) U.S. Cl.
CPC .......... *H01L 43/08* (2013.01); *G06F 12/0831* (2013.01); *G11C 11/161* (2013.01); *G11C 11/1653* (2013.01); *H01L 27/222* (2013.01); *H01L 43/02* (2013.01); *G06F 2212/621* (2013.01); *H01L 27/228* (2013.01); *H01L 28/75* (2013.01); *H01L 43/12* (2013.01)

(58) Field of Classification Search
CPC ......... H01L 43/08; H01L 43/02; H01L 28/55; H01L 28/75; H01L 27/228; H01L 27/222; H01L 43/12; G11C 11/161; G11C 11/16; G06F 12/0831
USPC ......... 257/421, 422, 295, E21.003, E21.665; 365/158, 173, 171; 438/3, 168, 48
See application file for complete search history.

(56) References Cited

U.S. PATENT DOCUMENTS

| | | | |
|---|---|---|---|
| 8,786,039 B2 | 7/2014 | Apalkov et al. | |
| 8,865,326 B2 | 10/2014 | Fukumoto et al. | |
| 2009/0237987 A1* | 9/2009 | Zhu .................. | G11C 11/15 365/171 |
| 2012/0018824 A1* | 1/2012 | Lim .................. | H01L 27/228 257/421 |

(Continued)

FOREIGN PATENT DOCUMENTS

| | | |
|---|---|---|
| KR | 10-0890323 B1 | 3/2009 |
| KR | 10-2014-0131136 A | 11/2014 |
| KR | 10-2017-0047683 | 5/2017 |

*Primary Examiner* — Thinh T Nguyen
(74) *Attorney, Agent, or Firm* — Perkins Coie LLP

(57) ABSTRACT

Provided is an electronic device including a semiconductor memory. The semiconductor memory may include: a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer.

19 Claims, 10 Drawing Sheets

(56) References Cited

U.S. PATENT DOCUMENTS

| | | | |
|---|---|---|---|
| 2016/0155485 A1* | 6/2016 | Dieny | G11C 11/161 |
| | | | 365/158 |
| 2016/0314825 A1* | 10/2016 | Sukegawa | G11C 11/161 |
| 2017/0117457 A1* | 4/2017 | Noh | G06F 3/0685 |
| 2017/0140784 A1* | 5/2017 | Sukegawa | G11B 5/653 |
| 2017/0155042 A1* | 6/2017 | Yuasa | H01L 43/10 |

* cited by examiner

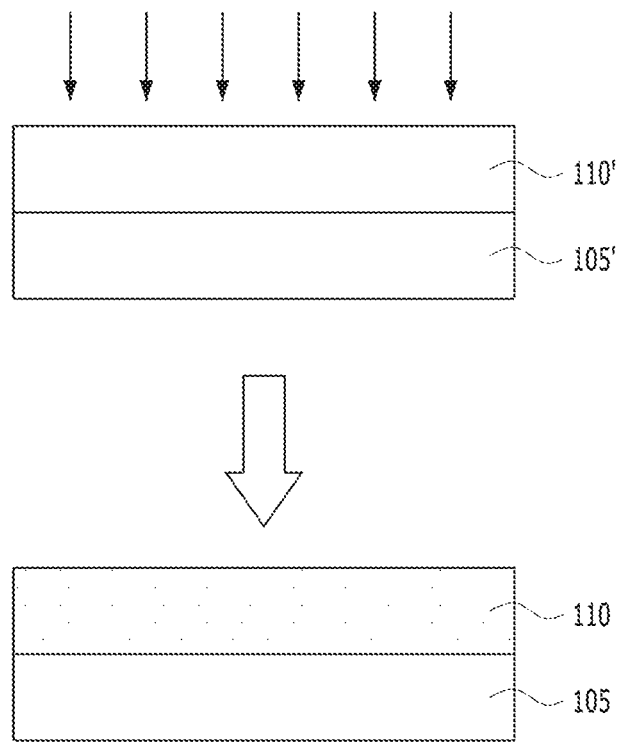

ELECTRONIC DEVICE AND METHOD FOR FABRICATING THE SAME

CROSS-REFERENCE TO RELATED APPLICATIONS

The present application claims priority of Korean Patent Application No. 10-2015-0168587, entitled "ELECTRONIC DEVICE AND METHOD FOR FABRICATING THE SAME" and filed on Nov. 30, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of improving the characteristics of a variable resistance element.

In an implementation, there is provided an electronic device including a semiconductor memory. The semiconductor memory may include: a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer.

Implementations of the above electronic device may include one or more the following.

The bottom layer comprises an MgO layer. The tunnel barrier layer and the bottom layer comprise a same material. The bottom layer has a smaller thickness than the tunnel barrier layer. A content of Ge contained in the CoFeGeB alloy is less than 10%. The semiconductor memory further comprises a buffer layer positioned under the bottom layer, and having a BCC structure to promote crystal growth of the bottom layer. The buffer layer comprises a CoFe layer. The free layer, the tunnel barrier layer, and the pinned layer have sidewalls which are aligned with each other, and the bottom layer has sidewalls which are not aligned with the sidewalls of the free layer, the tunnel barrier layer, and the pinned layer. The top surface of the bottom layer has a larger width than the bottom surface of the free layer. The free layer, the tunnel barrier layer, and the pinned layer have sidewalls which are aligned with each other, the bottom layer and the buffer layer have sidewalls which are aligned with each other, and the sidewalls of the free layer, the tunnel barrier layer, and the pinned layer are not aligned with the sidewalls of the bottom layer and the buffer layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device including a semiconductor memory may include: forming a bottom layer over a substrate, the bottom layer having a B2 structure to improve the perpendicular magnetic crystalline anisotropy of a free layer; forming the free layer over the bottom layer, the free layer including a CoFeGeB alloy and having a changeable magnetization direction that is perpendicular to the free layer; forming a tunnel barrier layer over the free layer, the tunnel barrier layer enabling electron tunneling; and forming a pinned layer over the tunnel barrier layer, the pinned layer having a pinned magnetization direction that is perpendicular the pinned layer.

Implementations of the above method may include one or more the following.

The forming of the bottom layer comprises: forming an amorphous CoFeB layer over the substrate; forming an initial bottom layer including MgO over the amorphous CoFeB layer; and performing a heat treatment to acquire the bottom layer including an MgO layer having the B2 structure. During the heat treatment, the amorphous CoFeB layer is transformed into a CoFe layer with a BCC structure. The forming of the free layer comprises: forming a CoFeB layer; forming a Ge layer relative to the CoFeB layer; and performing a heat treatment. The thickness of the Ge layer with respect to the CoFeB layer is less than 1/9. The forming of the Ge layer is performed before or after the forming of the CoFeB layer. The forming of the Ge layer and the forming of the CoFeB layer are alternately performed one or more times. The forming of the free layer is performed through a physical deposition process using CoFeGeB alloy target. The forming of the free layer is performed through a physical deposition process using CoFeB target and Ge target at the same time.

These and other aspects, implementations and associated advantages are described in greater detail in the drawings, the description and the claims.

BRIEF DESCRIPTION OF THE DRAWINGS

FIG. 5 is a cross-sectional view for describing an example of a method for fabricating a buffer layer and a bottom layer of FIG. 1.

DETAILED DESCRIPTION

Figure 1:
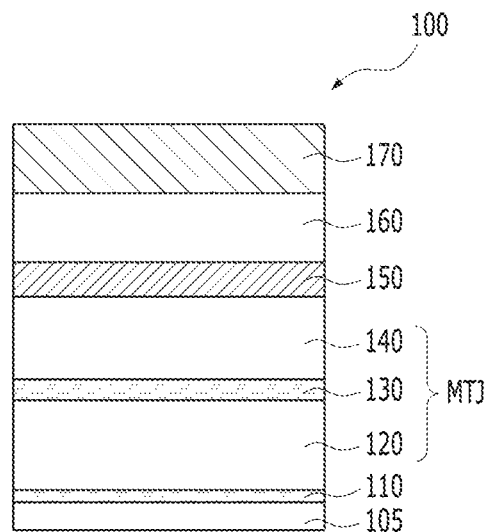
FIG. 1 is a cross-sectional view of a variable resistance element in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A variable resistance element indicates an element which is capable of switching between different resistance states according to a voltage or current applied across the variable resistance element. According to the resistance states of the variable resistance element, different data may be stored in the variable resistance element. That is, the variable resistance element may function as a memory cell. The memory cell may include a variable resistance element and a selecting element which is coupled to the variable resistance element and controls access to the variable resistance element. The plurality of memory cells may be arranged in various manners to form a semiconductor memory.

In particular, the variable resistance element may include an MTJ (Magnetic Tunnel Junction) structure including a free layer having a changeable magnetization direction, a pinned layer having a pinned magnetization direction, and a tunnel barrier layer interposed between the free layer and the pinned layer. According to a voltage or current applied to the variable resistance element, the magnetization direction of the free layer may be changed to be parallel or anti-parallel to the magnetization direction of the pinned layer. Thus, the variable resistance element may switch between a low resistance and a high resistance state. The following implementations provide an enhanced variable resistance element which is capable of satisfying or improving various characteristics which are required by the above-described variable resistance element.

FIG. 1 is a cross-sectional view of a variable resistance element in accordance with an implementation.

Referring to FIG. 1, the variable resistance element 100 in accordance with the implementation may have an MTJ structure including a free layer 120 having a changeable magnetization direction, a tunnel barrier layer 130 positioned over the free layer 120, and a pinned layer 140 positioned over the tunnel barrier layer 130 and having a pinned magnetization direction.

The free layer 120 has a changeable magnetization direction to store different data based on different resistance states of the reistance across the MJT junction between the two magnetic layers 140 and 120 that correspond to the different magnetization directions of the free layer 120 with respect to the pinned magnetization direction of the pinned layer 140. Different data bits can be represented by the different resistance values, e.g., a bit "0" may be represented by one resistance state such as a low resistance state while a bit "1" may be represented by another resistance state such as a high resistance state, or vice versa. For this reason, the free layer 120 may be referred to as a storage layer. In some implementations, the magnetization direction of the free layer 120 may be substantially perpendicular to the surface thereof so that the magnetization direction of the free layer 120 may be substantially parallel to the direction in which the free layer 120, the tunnel barrier layer 130, and the pinned layer 140 are stacked. In such implementations, the magnetization direction of the free layer 120 may be changed between the first direction from bottom to top and the second direction from bottom to top. The magnetization direction of the free layer 120 may be changed by spin transfer torque. In some implementations, the free layer 120 may include a CoFeGeB alloy as a ferromagnetic material. Furthermore, the content of Ge in the CoFeGeB alloy may be less than 10% in certain implementations.

During a write operation which changes the resistance state of the variable resistance element 100, the tunnel barrier layer 130 may change the magnetization direction of the free layer 120 through electron tunneling between the free layer 120 and the pinned layer 140. The tunnel barrier layer 130 may include an insulating oxide such as MgO, CaO, SrO, TiO, VO, or NbO.

Since the pinned layer 140 has a pinned magnetization direction which can be compared to the magnetization direction of the free layer 120, the pinned layer 140 may be referred to as a reference layer. FIG. 1 illustrates that the pinned layer 140 has a magnetization direction from top to bottom. However, the pinned layer 140 may have a magnetization direction from bottom to top. The pinned layer 140 may have a single-layer or multilayer structure including a ferromagnetic material. For example, the pinned layer 140 may include an alloy based on Fe, Ni, or Co, for example, Fe—Pt alloy, Fe—Pd alloy, Co—Pd alloy, Co—Pt alloy, Fe—Ni—Pt alloy, Co—Fe—Pt alloy, Co—Ni—Pt alloy, Fe—Pd alloy, Co—Pd alloy, Co—Pt alloy, Fe—Ni—Pt alloy, Co—Fe—Pt alloy, or Co—Ni—Pt alloy, or have a stacked structure of Co/Pt or Co/Pt.

In implementations of an MTJ structure, when a voltage or current is applied to the top and bottom of the variable resistance element 100, the magnetization direction of the free layer 120 may be changed by spin transfer torque carried by the spins of the electrons in the current flowing through the MTJ junction. When the magnetization directions of the free layer 120 and the pinned layer 140 are parallel to each other, the variable resistance element 100 may have a low resistance state, and store data "1", for example. On the other hand, when the magnetization directions of the free layer 120 and the pinned layer 140 are anti-parallel to each other, the variable resistance element 100 may have a high resistance state, and store data "0", for example.

In addition to the MTJ structure, the variable resistance element 100 may further include a plurality of layers for various uses, including improving the fabrication process or the characteristics of the MTJ structure. For example, as illustrated in FIG. 1, the variable resistance element 100 may further include a buffer layer 105, a bottom layer 110, a spacer layer 150, a magnetic correction layer 160, and a capping layer 170.

The bottom layer 110 may serve to improve the perpendicular magnetic crystalline anisotropy of the free layer 120, while being in direct contact with the bottom surface of the free layer 120 under the free layer 120. MgO materials can be in differnet crystalline structures known as the rocksalt crystal structure (B1) or caesium chloride (B2) structure. In some implementations, for example, when the free layer 120 includes CoFeGeB alloy, the bottom layer 110 may include a MgO layer with the caesium chloride (B2) structure, as a material layer having a crystalline structure in the (001) direction. When the CoFeGeB alloy is formed over the MgO layer with the B2 structure, the perpendicular magnetic anisotropy may increase, which was experimentally confirmed (refer to FIGS. 2A to F3).

Figure 2A:
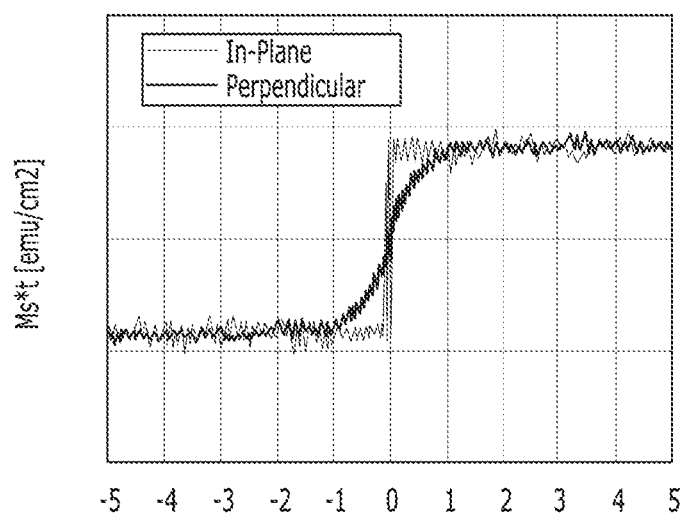
FIG. 2A is a graph illustrating the hysteresis loop of a variable resistance element in accordance with a comparative example.
Figure 2B:
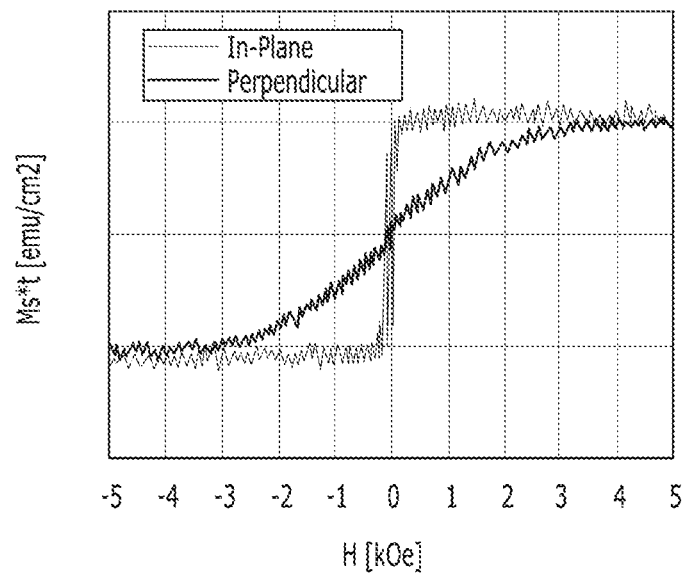
FIG. 2B is a graph illustrating the hysteresis loop of the variable resistance element in accordance with the present implementation.
Figure 3:
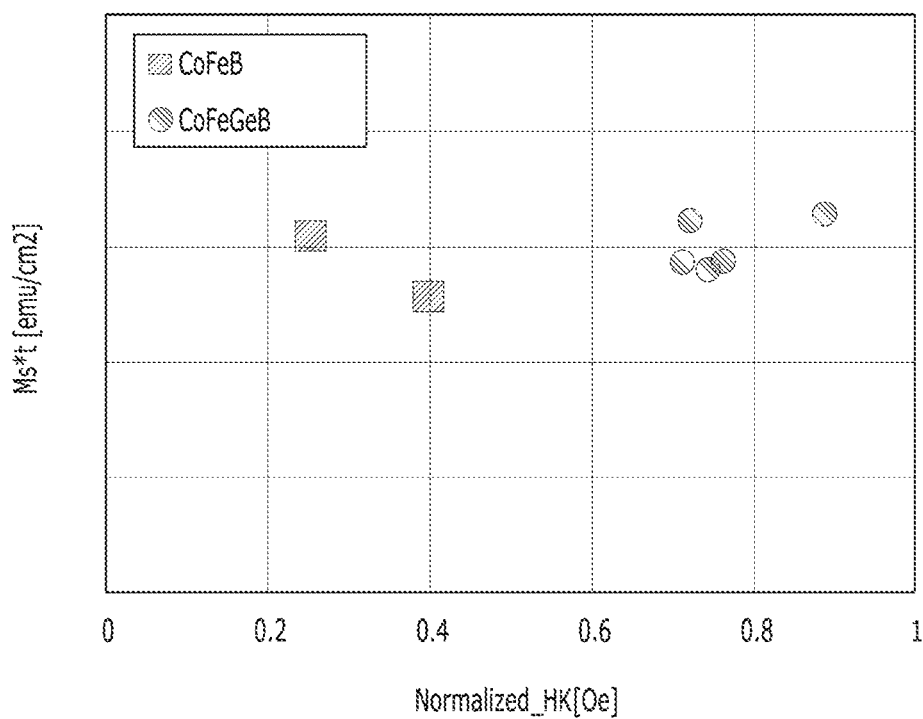
FIG. 3 is a graph illustrating the perpendicular magnetic anisotropy of a free layer in accordance with the comparative example and the perpendicular magnetic anisotropy of a free layer in accordance with the present implementation.

Furthermore, in order to provide a smooth current flow through the variable resistance element 100, the bottom layer 110 may have a small thickness. For example, in some implementations where the bottom layer 110 includes substantially the same material as the material forming the tunnel barrier layer 130 (e.g., MgO), the bottom layer 110 may have a smaller thickness than the tunnel barrier layer 130. Although the bottom layer 110 has a small thickness, a desired perpendicular magnetic anisotropy may be maintained, which was experimentally confirmed as shown by FIGS. 2A, 2B and 3). When the thickness of the bottom layer 110 is reduced, the etching time may be reduced during a patterning process for forming the variable resistance element 100, which makes it possible to reduce defects which are formed at the sidewalls of the variable resistance element 100 by etching.

Under the bottom layer 110, the buffer layer 105 may be formed to promote the growth of crystal in the (001) direction of the bottom layer 110. The buffer layer 105 may include a material layer with the BCC structure, for example, CoFe layer with the BCC structure. When the buffer layer 105 is added under the bottom layer 110, the buffer layer 105 may promote the crystal growth of the bottom layer 110. As a result, the perpendicular magnetic anisotropy of the free layer 120 may be further improved.

The magnetic correction layer 160 may be used to offset or reduce the influence of a stray field caused by the pinned layer 140 at the free layer 120. The influence on the free layer 120 by the stray field of the pinned layer 140 may be lowered or reduced by a biased magnetic field that is present in the free layer 120 and is produced by the magnetic correction layer 160. The magnetic correction layer 160 may have a magnetization direction anti-parallel to the magnetization direction of the pinned layer 140 so that the magnetic fields in the free layer 120 produced by the layers 160 and 140 are opposite to each other to cancel out. In some implementations, when the pinned layer 140 has a magnetization direction from top to bottom, the magnetic correction layer 160 may have a magnetization direction from bottom to top. On the other hand, when the pinned layer 140 has a magnetization direction from bottom to top, the magnetic correction layer 160 may have a magnetization direction from top to bottom. The magnetic correction layer 160 may have a single-layer or multilayer structure including a ferromagnetic material.

In the illustrated example in FIG. 1, the magnetic correction layer 160 may exist over the pinned layer 140. In other examples, the position of the magnetic correction layer 160 may be placed at different locations relative to the pinned layer 140 in various manners. For example, the magnetic correction layer 160 may be positioned under the MTJ structure so that the magnetic correction lauyer 160 is below the pinned layer 140. Furthermore, the magnetic correction layer 160 may be arranged at the top, bottom, or side of the MTJ structure, while being patterned separately from the MTJ structure.

The spacer layer 150 may be interposed between the magnetic correction layer 160 and the pinned layer 140, and serve to improve the characteristics of the magnetic correction layer 160 while serving as a buffer between the magnetic correction layer 160 and the pinned layer 140. The spacer layer 150 may include a precious metal such as Ru.

The capping layer 170 may serve as a hard mask when the variable resistance element 100 is patterned, and include various conductive materials such as metal. In particular, the capping layer 170 may be formed of a metal-based material which has a small number of pin holes therein and has large resistance to wet and/or dry etching. The capping layer 170 may include a precious metal such as Ru.

There are certain advantages in connection with the variable resistance element 100 in which a CoFeGeB alloy is used as the free layer 120 and a MgO layer with the B2 structure is formed to a small thickness as the bottom layer 110 under the free layer 120. Such advantages are described with reference to FIGS. 2A, 2B and 3.

FIG. 2A is a graph illustrating the hysteresis loop of a variable resistance element in accordance with a comparative example, and FIG. 2B is a graph illustrating the hysteresis loop of the variable resistance element in accordance with the present implementation. The variable resistance element in accordance with the comparative example uses CoFeB alloy as the free layer and uses metal as the bottom layer under the free layer. The variable resistance element in accordance with the present implementation uses CoFeGeB alloy as the free layer, uses MgO layer with the B2 structure as the bottom layer under the free layer, and has a Ge content of 10% or less.

Referring to FIGS. 2A and 2B, the comparative example and the present implementation exhibit similar perpendicular magnetization characteristics. In other words, although the CoFeB alloy which is mainly used as the free layer is replaced with the CoFeGeB alloy as in the present implementation, the perpendicular magnetization characteristic may not be degraded as long as the bottom layer is properly selected.

FIG. 3 is a graph illustrating the perpendicular magnetic anisotropy of the free layer in accordance with the comparative example and the perpendicular magnetic anisotropy of the free layer in accordance with the present implementation. In FIG. 3, the horizontal axis indicates a normalized Hk (perpendicular anisotropy field) value, and the vertical axis indicates a value of Ms*t, where M represents magnetization saturation and t represents the thickness of the free layer. The free layer in accordance with the comparative example may be formed over the metal bottom layer while including the CoFeB alloy, and the free layer in accordance with the preset implementation may be formed over the MgO bottom layer while the including CoFeGeB alloy.

FIG. 3 illustrates that the Hk value of the free layer in accordance with the present implementation is significantly increased in comparison to the free layer in accordance with the comparative example. That is, the perpendicular magnetic anisotropy of the free layer in accordance with the present implementation is improved. As a result, the thermal stability of the free layer in accordance with the present implementation may be improved. For reference, the thermal stability Δ may be expressed as Equation 1 below.

$$\Delta = \frac{Ms * t * S * Hk}{2k_B T} \quad (1)$$

In Equation 1, S represents the area of the free layer, $k_B$ represents the Boltzmann constant, and T represents temperature.

Referring to Equation (1), when the Hk value is increased, the thermal stability may be increased because the thermal stability is proportional to the Hk value of the free layer.

In light of th above desciption, when the variable resistance element 100 in accordance with the present implementation uses CoFeGeB alloy as the free layer 120 and uses MgO layer with the B2 structure as the bottom layer 110 under the free layer 120, high perpendicular magnetic anisotropy and thermal stability can be secured. As a result, the data storage characteristic and operation characteristic of the variable resistance element 100 can be improved.

The free layer 120 including CoFeGeB alloy may be formed through various methods. The methods will be described with reference to FIGS. 4A and 4B.

Figure 4A:
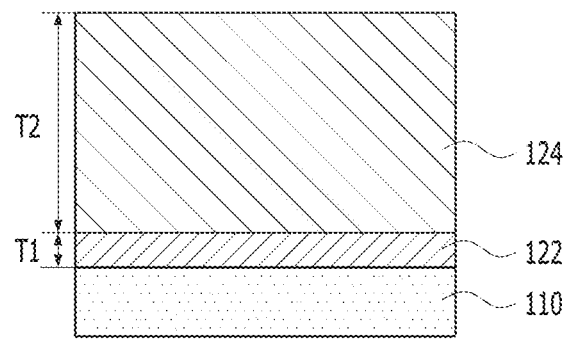
FIG. 4A is a cross-sectional view for describing an example of a method for fabricating the free layer of FIG. 1.
Figure 4B:
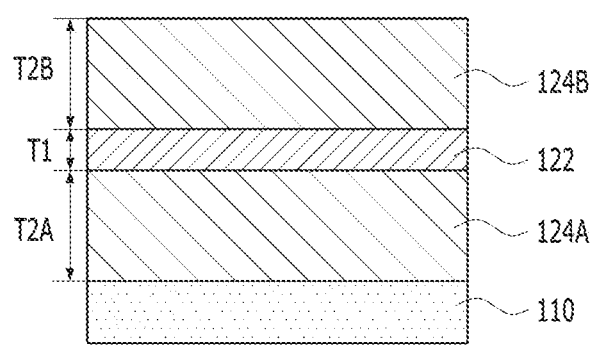
FIG. 4B is a cross-sectional view for describing another example of the method for fabricating the free layer of FIG. 1.

FIG. 4A is a cross-sectional view for describing an example of a method for fabricating the free layer of FIG. 1, and FIG. 4B is a cross-sectional view for describing another example of the method for fabricating the free layer of FIG. 1.

Referring to FIG. 4A, a Ge layer 122 having a first thickness T1 may be deposited over the bottom layer 110. Then, a CoFeB layer 124 having a second thickness T2 larger than the first thickness T1 may be deposited over the Ge layer 122. Then, a heat treatment may be performed to form CoFeGeB alloy through a reaction between the Ge layer 122 and the CoFeB layer 124. The ratio of the first thickness T1 to the second thickness T2 may be adjusted in such a manner that the content of Ge in the CoFeGeB alloy is less than 10%. For example, the ratio of the first thickness T1 to the second thickness T2 may be adjusted to approximately 1/9 or less.

The sequence in which the Ge layer 122 and the CoFeB layer 124 are stacked may be changed. For example, in a different layer structrue, after the CoFeB layer 124 is formed, the Ge layer 122 may be additionally formed over the CoFeB layer 124.

Referring to FIG. 4B, a first CoFeB layer 124A, a Ge layer 122, and a second CoFeB layer 124B may be sequentially deposited on the bottom layer 110, and a heat treatment may be performed to form CoFeGeB alloy. The sum of the thickness T2A of the first CoFeB layer 124A and the thickness T2B of the second CoFeB layer 124B may be substantially equal to the second thickness T2 of FIG. 4A.

For another example, which is not illustrated, a plurality of CoFeB layers and a plurality of Ge layers may be alternately deposited, and a heat treatment may be then performed to form CoFeGeB alloy.

For another example, which is not illustrated, CoFeGeB alloy may be formed through a physical deposition process using CoFeGeB alloy target, for example, a sputtering process.

For another example, which is not illustrated, CoFeGeB alloy may be formed through a physical deposition process using CoFeB alloy target and Ge target, for example, a co-sputtering process.

The method for forming a stacked structure of the buffer layer 105 and the bottom layer 110 in FIG. 1 will be described with reference to FIG. 5.

FIG. 5 is a cross-sectional view for describing an example of a method for fabricating the buffer layer and the bottom layer of FIG. 1.

Referring to FIG. 5, an amorphous CoFeB layer may be deposited as an initial buffer layer 105' over a substrate (not illustrated) having a predetermined lower structure formed therein. Then, an MgO layer may be deposited as an initial bottom layer 110' over the initial buffer layer 105'. Since the crystal structure of the initial bottom layer 110' is affected by the initial buffer layer 105', the crystal growth in the (001) direction at the initial bottom layer 110' may not be outstanding.

Then, a heat treatment may be performed on the resultant structure in which the initial buffer layer 105' and the initial bottom layer 110' are formed, thereby completing the buffer layer 105 and the bottom layer 110 of FIG. 1. During the heat treatment, the amorphous state may be changed to the BCC structure while boron is removed from the initial buffer layer 105'. As a result, a CoFe layer with the BCC structure may be acquired. Furthermore, as the crystalline structure of the initial bottom layer 110' is transformed by the CoFe layer with the BCC structure, the MgO layer with the BC structure may be acquired.

The plurality of variable resistance elements 100 may be provided to form a semiconductor memory. The semiconductor memory may include various components such as lines and elements, in order to drive both ends of each of the variable resistance elements 100. This structure will be described with reference to FIGS. 6A and 6B.

Figure 6A:
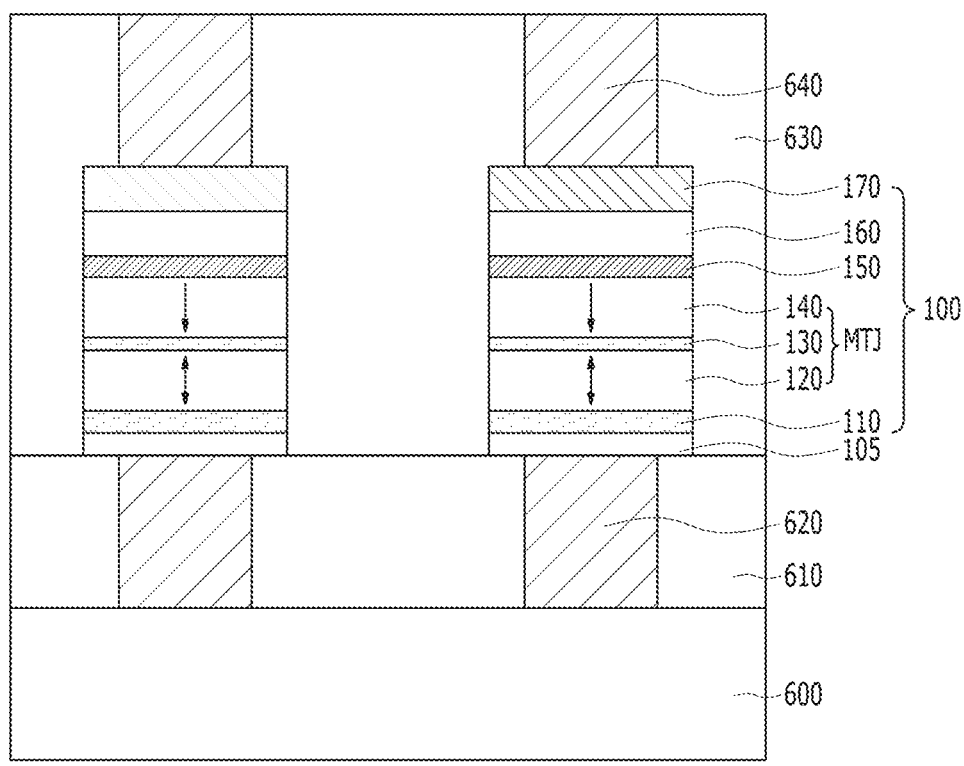
FIG. 6A is a cross-sectional view for describing a memory device and a method for fabricating the same in accordance with an implementation.

FIG. 6A is a cross-sectional view for describing a memory device and a method for fabricating the same in accordance with an implementation.

Referring to FIG. 6A, the memory device in accordance with the present implementation may include a substrate 600, a plurality of bottom contacts 620, a plurality of variable resistance elements 100, and a plurality of top contacts 640. The substrate 600 may include predetermined elements (not illustrated) formed therein. For example, the substrate 600 may include transistors for controlling access to the variable resistance elements 100. The bottom contacts 620 may be positioned over the substrate 600 and connect the bottoms of the variable resistance elements 100 to parts of the substrate 600, for example, the drains of the transistors, respectively. The variable resistance elements 100 may be positioned over the bottom contacts 620. The top contacts 640 may be positioned over the variable resistance elements 100 and connect the tops of the variable resistance elements 100 to a predetermined line (not illustrated), for example, a bit line.

The memory device may be formed through the following method.

First, the substrate 600 having transistors formed therein may be prepared, and a first interlayer dielectric layer 610 may be formed over the substrate 600. Then, the first interlayer dielectric layer 610 may be selectively etched to form a hole which exposes a part of the substrate 600, and a conductive material may be buried in the hole so as to form a bottom contact 620. Then, material layers for forming a variable resistance element 100 may be formed over the bottom contact 620 and the first interlayer dielectric layer 610, and then selectively etched to form the variable resistance element 100. The etching process for forming the variable resistance element 100 may include the IBE method which has a strong physical etching characteristic. Then, a second interlayer dielectric layer 630 may be formed to cover the variable resistance element. Then, the second interlayer dielectric layer 630 may be selectively etched to form a hole which exposes the top of the variable resistance element 100, and a conductive material may be buried in the hole so as to form a top contact 640.

In the memory device in accordance with the present implementation, all layers forming the variable resistance element 100 may have sidewalls which are aligned with each other. That is because the variable resistance element 100 is formed through an etching process using one mask.

Unlike the embedment of FIG. 6A, a part of the variable resistance element 100 may be patterned separately from the other part. This process is illustrated in FIG. 6B.

Figure 6B:
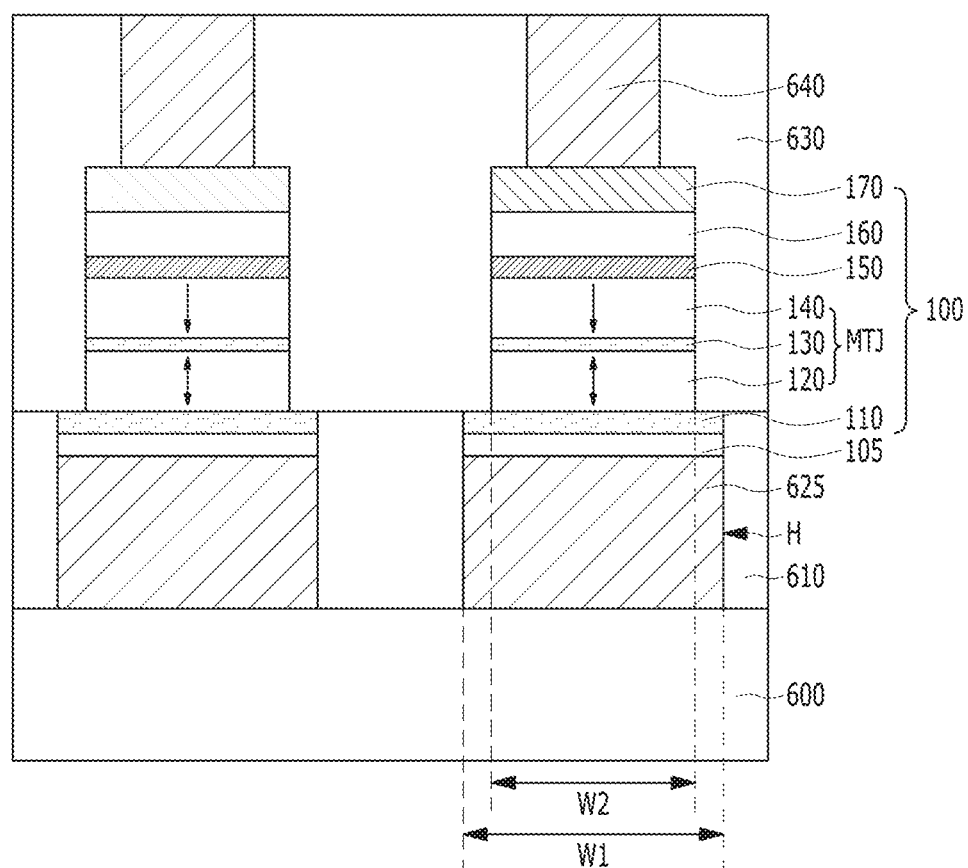
FIG. 6B is a cross-sectional view for explaining a memory device and a method for fabricating the same in accordance with an implementation.

FIG. 6B is a cross-sectional view for explaining a memory device and a method for fabricating the same in accordance with an implementation. The following descriptions will be focused on a difference from the implementation of FIG. 6A.

Referring to FIG. 6B, the memory device in accordance with the present implementation may include a variable resistance element 100 of which parts, for example, the bottom layer 110 and the buffer layer 105 have sidewalls that are not aligned with the other layers thereof. The bottom layer 110 and the buffer layer 105 may have sidewalls which are aligned with a bottom contact 625.

The memory device may be formed through the following method.

First, a first interlayer dielectric layer 610 may be formed over a substrate 600, and then selectively etched to form a hole H which expose a part of the substrate 600.

Then, a bottom contact 625 may be formed to fill the lower part of the hole H. More specifically, the bottom contact 625 may be formed through a series of processes of forming a conductive material to cover the resultant structure having the hole H formed therein, and removing a part of the conductive material through an etch back process or the like until the conductive material has a desired thickness.

Then, the buffer layer 105 and the bottom layer 110 may be formed to fill the other part of the hole H having the bottom contact 625 formed therein. More specifically, the buffer layer 105 may be formed through a series of processes of forming a material layer for the buffer layer 105 to cover the resultant structure having the bottom contact 625 formed therein, and removing a part of the material layer through an etch back process or the like until the material layer has a desired thickness. Furthermore, the bottom layer 110 may be formed through a series of processes of forming a material layer for the bottom layer 110 to cover the resultant structure in which the bottom contact 625 and the buffer layer 105 are formed, and perform a planarization process, for example, CMP (Chemical Mechanical Process) until the top surface of the first interlayer dielectric layer 610 is exposed. Then, material layers for forming the other layers of the variable resistance element 100 excluding the bottom layer 110 may be formed over the bottom layer 110 and the first interlayer dielectric layer 610, and then selectively etched to form the other layers of the variable resistance element 100. The subsequent processes may be performed in substantially the same manner as described with reference to FIG. 6A.

In the present implementation, the height which needs to be etched at a time in order to form the variable resistance element 100 may be reduced, which makes it possible to lower the difficulty level of the etching process.

In the present implementation, the width W1 of the top surface of the bottom layer 110 may be equal to or more than the width W2 of the bottom surface of the MTJ structure. Thus, the entire MTJ structure may exist over the bottom layer 110. When the width W1 of the top surface of the bottom layer 110 is smaller than the width W2 of the bottom surface of the MTJ structure, the MTJ structure may be positioned at the boundary between the bottom layer 110 and the interlayer dielectric layer 610. In this case, a defect may occur while a part of the MTJ structure is bent. For example, when the tunnel barrier layer 130 of the MTJ structure is bent, the characteristic of the MTJ structure may be degraded by Neel coupling. In the present implementation, however, since the MTJ structure is formed on the surface with excellent flatness, such problems can be prevented.

When the width W1 of the top surface of the bottom layer 110 is larger than the width W2 of the bottom surface of the MTJ structure, a part of the bottom layer 110 may be exposed to redeposit the material forming the bottom layer 110 on the sidewalls of the MTJ structure. However, when the bottom layer 110 includes an MgO layer with the insulating property as in the present implementation, the material forming the bottom layer 110 may not serve as a leakage path, even though the material is re-deposited on the sidewalls of the MTJ structure.

In accordance with the implementations, the electronic device including a semiconductor memory and the method for fabricating the same can improve the characteristics of the variable resistance element.

The above and other memory circuits or semiconductor devices based on the disclosed technology can be used in a range of devices or systems. FIGS. 7-11 provide some examples of devices or systems that can implement the memory circuits disclosed herein.

Figure 7:
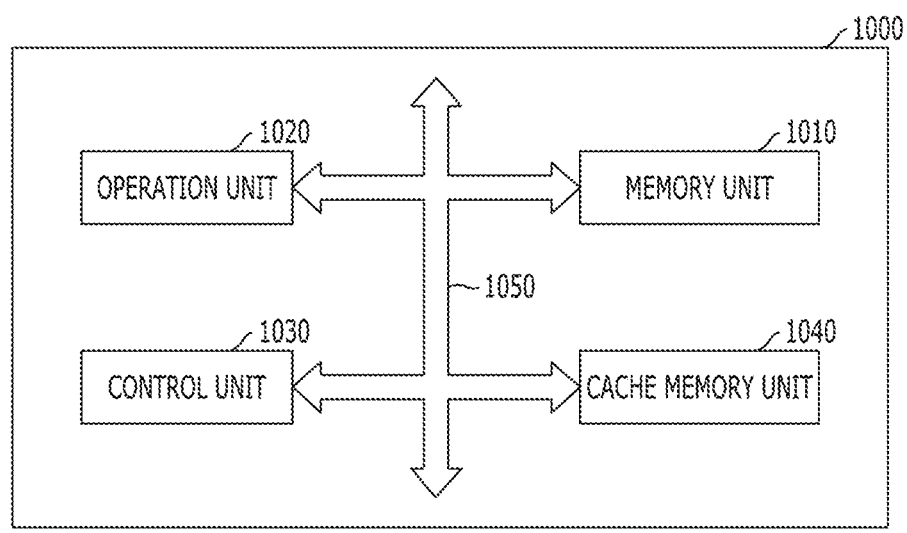
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
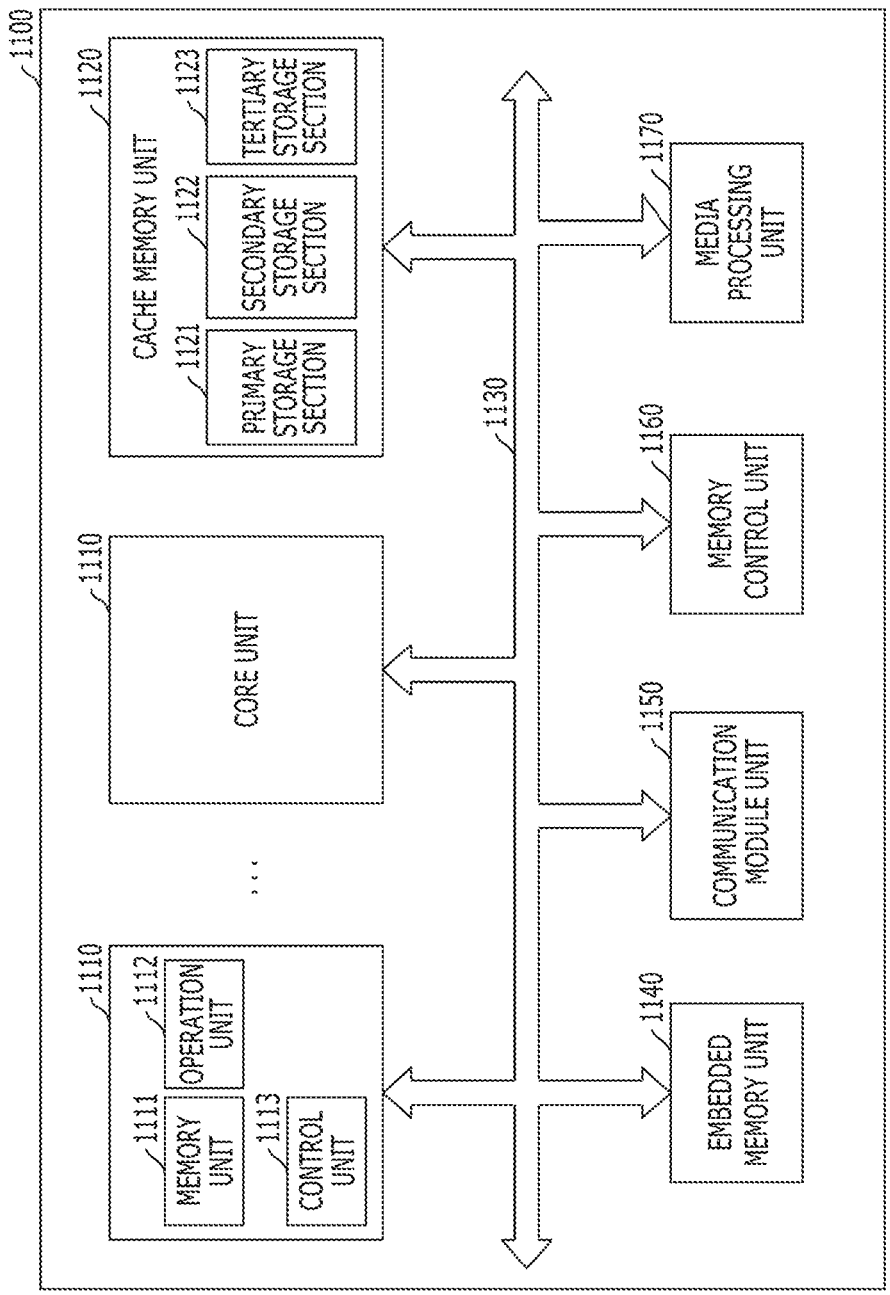
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer. Through this, data storage characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device.

Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
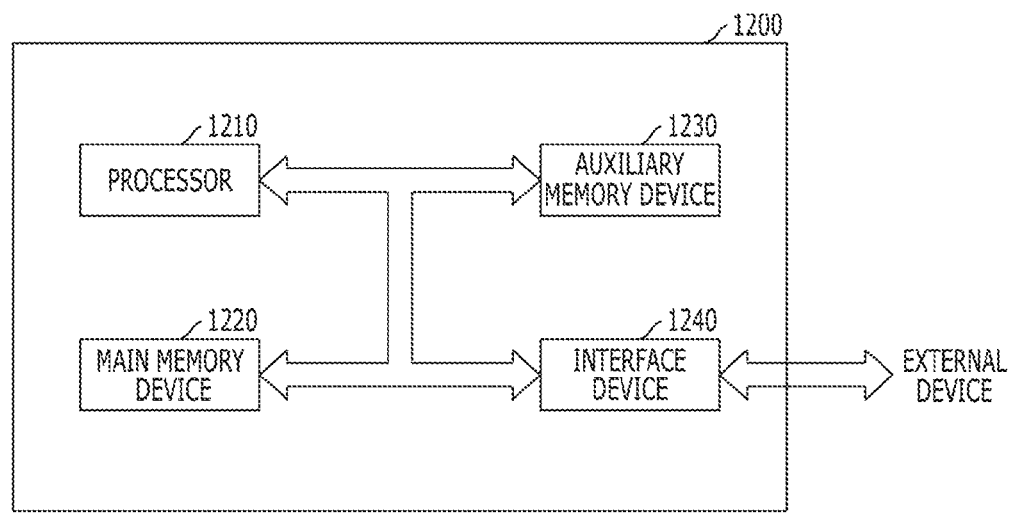
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
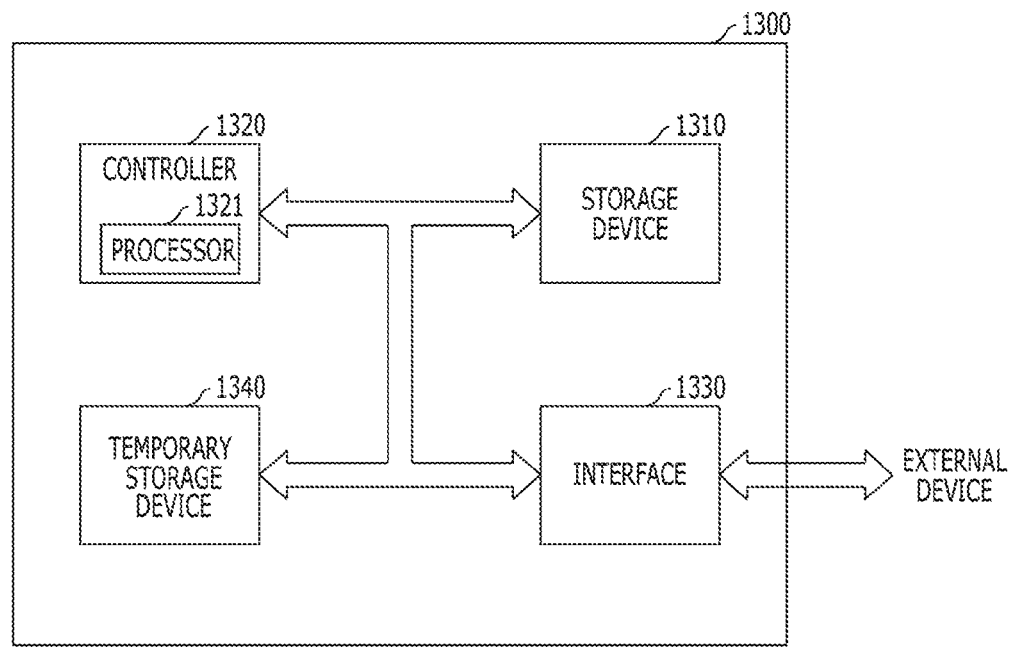
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer. Through this, data storage characteristics of the storage device 1310 or the temporary storage device 1340 may be improved. As a consequence, operating characteristics and data storage characteristics of the data storage system 1300 may be improved.

Figure 11:
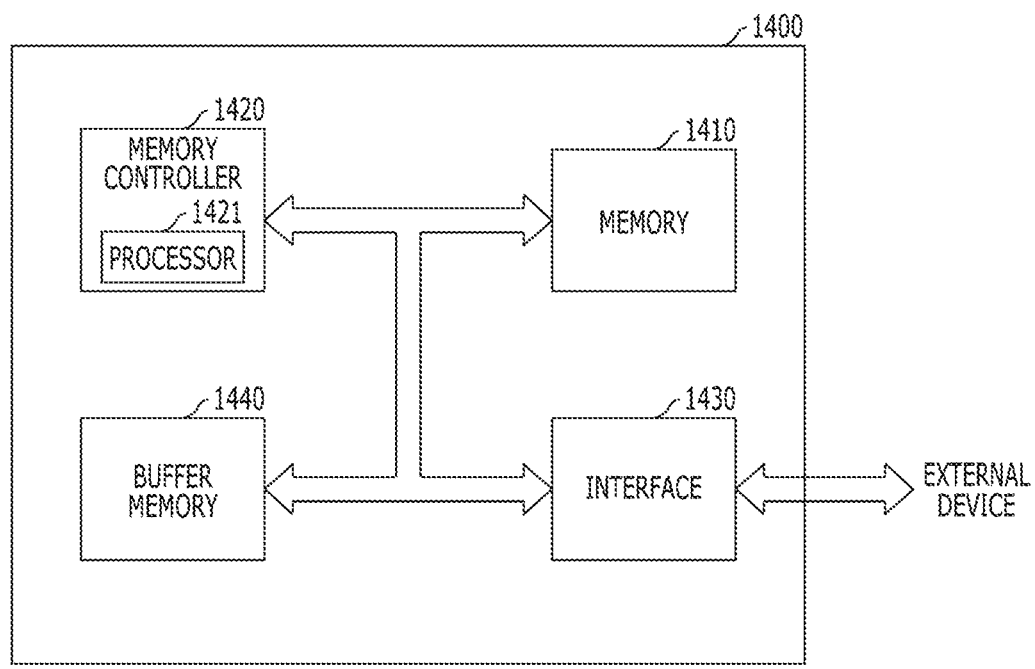
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer. Through this, data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a free layer comprising CoFeGeB alloy, and having a changeable magnetization direction that is perpendicular to the free layer; a tunnel barrier layer positioned over the free layer, and configured for enabling electron tunneling; a pinned layer positioned over the tunnel barrier layer, and having a pinned magnetization direction that is perpendicular to the pinned layer; and a bottom layer positioned under the free layer, and having a B2 structure to improve a perpendicular magnetic crystalline anisotropy of the free layer. Through this, data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAIVI), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   a free layer comprising CoFeGeB alloy, and having a changeable magnetization direction that is perpendicular to the free layer;
   a tunnel barrier layer positioned over the free layer, and configured for enabling electron tunneling;
   a pinned layer positioned over the tunnel barrier layer, and having a pinned magnetization direction that is perpendicular to the pinned layer; and
   a bottom layer positioned under the free layer and including a material having a caesium chloride (B2) structure and in direct contact with the CoFeGeB alloy to improve a perpendicular magnetic crystalline anisotropy of the free layer.

2. The electronic device of claim 1, wherein the bottom layer comprises an MgO layer.

3. The electronic device of claim 1, wherein the tunnel barrier layer and the bottom layer comprise a same material.

4. The electronic device of claim 3, wherein the bottom layer has a smaller thickness than the tunnel barrier layer.

5. The electronic device of claim 1, wherein a content of Ge contained in the CoFeGeB alloy is less than 10%.

6. The electronic device of claim 1, wherein the semiconductor memory further comprises a buffer layer positioned under the bottom layer, and having a BCC structure to promote crystal growth of the bottom layer.

7. The electronic device of claim 6, wherein the buffer layer comprises a CoFe layer.

8. The electronic device of claim 1, wherein the free layer, the tunnel barrier layer, and the pinned layer have sidewalls which are aligned with each other, and
the bottom layer has sidewalls which are not aligned with the sidewalls of the free layer, the tunnel barrier layer, and the pinned layer.

9. The electronic device of claim 8, wherein the top surface of the bottom layer has a larger width than the bottom surface of the free layer.

10. The electronic device of claim 6, wherein the free layer, the tunnel barrier layer, and the pinned layer have sidewalls which are aligned with each other,
the bottom layer and the buffer layer have sidewalls which are aligned with each other, and
the sidewalls of the free layer, the tunnel barrier layer, and the pinned layer are not aligned with the sidewalls of the bottom layer and the buffer layer.

11. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

12. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

13. The electronic device of claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

14. The electronic device of claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

15. The electronic device of claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

16. The electronic device of claim 1, further comprising a magnetic correction layer positioned over the pinned layer and including a magnetization direction anti-parallel to that of the pinned layer.

17. The electronic device of claim 16, further comprising a spacer layer interposed between the magnetic correction layer and the pinned layer and including a metal.

18. The electronic device of claim 1, wherein the bottom layer has a crystalline structure in a (001) direction.

19. The electronic device of claim 1, wherein the tunnel barrier layer includes an MgO layer.

* * * * *